United States Patent [19]
Teong

[11] Patent Number: 6,025,634
[45] Date of Patent: *Feb. 15, 2000

[54] INTEGRATED CIRCUIT HAVING FORMED THEREIN LOW CONTACT LEAKAGE AND LOW CONTACT RESISTANCE INTEGRATED CIRCUIT DEVICE ELECTRODE

[75] Inventor: Su Ping Teong, Singapore, Singapore

[73] Assignee: Chartered Semiconductor Manufacturing, Ltd., Singapore, Singapore

[*] Notice: This patent issued on a continued prosecution application filed under 37 CFR 1.53(d), and is subject to the twenty year patent term provisions of 35 U.S.C. 154(a)(2).

[21] Appl. No.: 08/843,992

[22] Filed: Apr. 17, 1997

Related U.S. Application Data

[62] Division of application No. 08/665,329, Jun. 17, 1996, Pat. No. 5,661,085.

[51] Int. Cl.[7] ...................................................... H01L 29/76
[52] U.S. Cl. ............................ 257/383; 257/384; 257/763
[58] Field of Search ..................................... 257/383, 384, 257/751, 763, 764, 765, 768, 769, 770

[56] References Cited

U.S. PATENT DOCUMENTS

| | | | |
|---|---|---|---|
| 4,378,383 | 3/1983 | Moritz | 427/96 |
| 4,448,800 | 5/1984 | Ehara et al. | 427/39 |
| 4,520,041 | 5/1985 | Aoyama et al. | 427/88 |
| 4,532,702 | 8/1985 | Gigante et al. | 29/578 |
| 4,544,445 | 10/1985 | Jeuch et al. | 156/643 |
| 4,592,802 | 6/1986 | Deleonibus et al. | 156/644 |
| 4,926,237 | 5/1990 | Sun et al. | 257/764 |
| 5,049,975 | 9/1991 | Ajika et al. | 257/764 |
| 5,298,784 | 3/1994 | Gambino et al. | 257/751 |
| 5,523,626 | 6/1996 | Hayashi et al. | 257/764 |
| 5,652,464 | 7/1997 | Liao et al. | 257/764 |
| 5,831,335 | 11/1998 | Miyamoto | 257/757 |

OTHER PUBLICATIONS

S. Wolf et al, "Silicon Processing For The VLSI Era, vol. 1" Lattice Press, Sunset Beach, CA, 1986, p 377–379.

*Primary Examiner*—Sara Crane
*Attorney, Agent, or Firm*—George O. Saile; Rosemary L. S. Pike; Alek P. Szecsy

[57] ABSTRACT

An integrated circuit having formed therein a low contact leakage and low contact resistance integrated circuit device electrode. The integrated circuit comprises a semiconductor substrate having an isolation region formed upon the semiconductor substrate. The isolation region bounds an active region of the semiconductor substrate adjoining the isolation region. There is formed at least in part within the active region of the semiconductor substrate an integrated circuit device. The integrated circuit device has an integrated circuit device electrode formed within a portion of the active region of the semiconductor substrate bounded by the isolation region. The integrated circuit also comprises a patterned metal silicide layer aligned upon the integrated circuit device electrode. Finally the integrated circuit also comprises a patterned metal silicide forming metal layer formed at least partially overlapping the patterned metal silicide layer and formed contiguously extending upon the isolation region, where the patterned metal silicide layer is formed employing a metal equivalent to the metal employed in forming the patterned metal silicide forming metal layer.

8 Claims, 4 Drawing Sheets

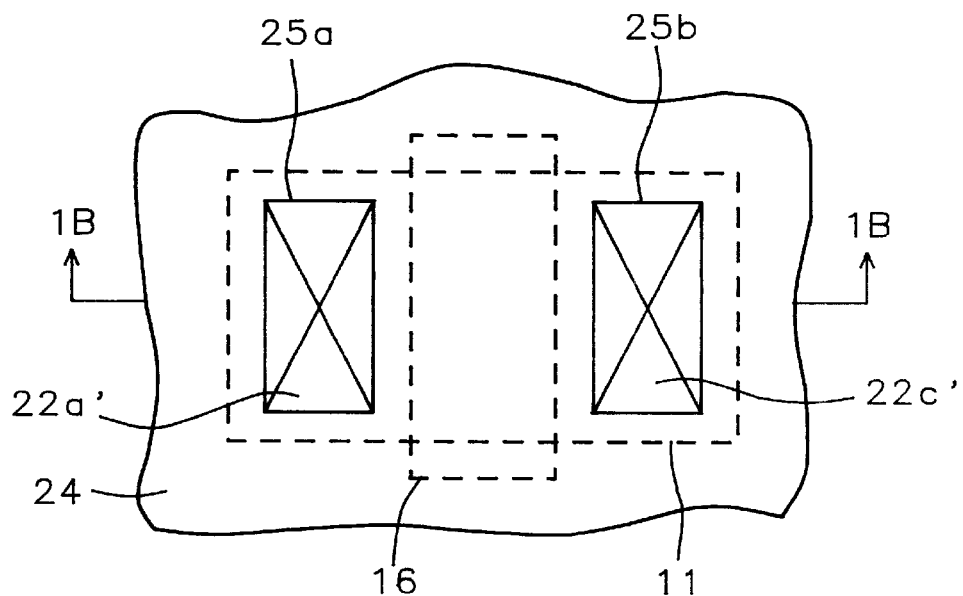
FIG. 1A — Prior Art
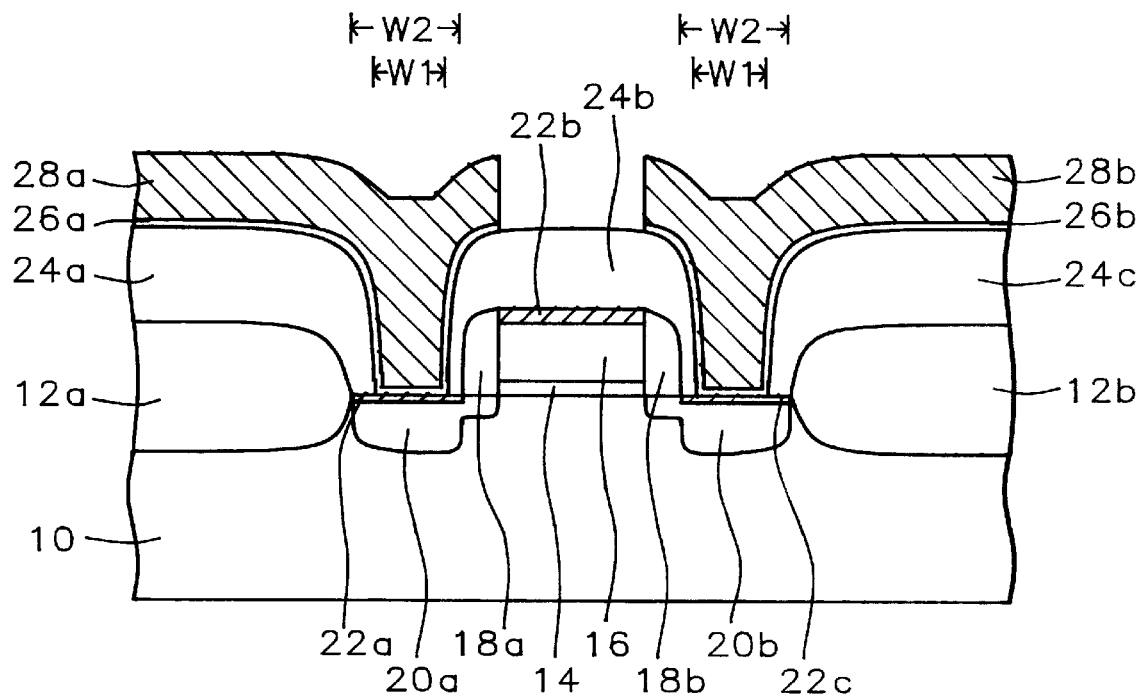
FIG. 1B — Prior Art ically important to form within advanced integrated circuits integrated circuit devices whose electrodes exhibit low contact leakage and low contact resistance. There are several factors of integrated circuit device electrode design and fabrication which influence the contact leakage and the contact resistance of those integrated circuit device electrodes. Included among the factors are: (1) the presence and thickness of a low contact resistance layer and/or a barrier layer separating the integrated circuit device electrode from a conductor element subsequently formed upon the integrated circuit device electrode; (2) the contact resistance of the material from which is formed the integrated circuit device electrode, the low contact resistance layer and/or the barrier layer, and (3) the overlap distance of a conductor element subsequently formed upon the integrated circuit device electrode.

INTEGRATED CIRCUIT HAVING FORMED THEREIN LOW CONTACT LEAKAGE AND LOW CONTACT RESISTANCE INTEGRATED CIRCUIT DEVICE ELECTRODE

CROSS-REFERENCE TO RELATED APPLICATION

This application is a division of application Ser. No. 08/665,329, filed Jun. 17, 1996, now U.S. Pat. No. 5,661,085, issued Aug. 26, 1997.

BACKGROUND OF THE INVENTION

1. Field of the Invention

The present invention relates generally to integrated circuit device electrodes formed within integrated circuits. More particularly, the present invention relates to low contact leakage and low contact resistance integrated circuit device electrodes efficiently formed within integrated circuits.

2. Description of the Related Art

As integrated circuit technology has advanced, and integrated circuit device and conductor element dimensions have decreased, it has become increasingly important to form within advanced integrated circuits integrated circuit devices whose electrodes exhibit low contact leakage and low contact resistance. There are several factors of integrated circuit device electrode design and fabrication which influence the contact leakage and the contact resistance of those integrated circuit device electrodes. Included among the factors are: (1) the presence and thickness of a low contact resistance layer and/or a barrier layer separating the integrated circuit device electrode from a conductor element subsequently formed upon the integrated circuit device electrode; (2) the contact resistance of the material from which is formed the integrated circuit device electrode, the low contact resistance layer and/or the barrier layer, and (3) the overlap distance of a conductor element subsequently formed upon the integrated circuit device electrode.

With regard to the presence and thickness of a low contact resistance layer formed upon the integrated circuit device electrode, it is common in the art of integrated circuit fabrication to form upon the surfaces of integrated circuit device electrodes metal silicide layers which provide low contact resistance layers through which may be formed low contact resistance connections when subsequently forming conductor elements upon those integrated circuit device electrodes. Such metal silicide layers are often formed in a self-aligned fashion to yield an integrated circuit structure analogous to the integrated circuit structure whose schematic plan-view diagram is illustrated in FIG. 1A and whose schematic cross-sectional diagram is illustrated in FIG. 1B.

Shown in FIG. 1A is a schematic plan-view diagram of an integrated circuit prior to forming upon its surface a patterned first conductor layer. Shown in FIG. 1A is a patterned Pre-Metal Dielectric (PDM) layer 24 having a pair of contact vias 25a and 25b formed therethrough which access a pair of exposed metal silicide layers 22a' and 22c'. The pair of exposed metal silicide layers 22a' and 22c' is formed within and upon an active region 11 of a semiconductor substrate within and upon which is formed the integrated circuit. The pair of exposed metal silicide layers 22a' and 22c' is separated by a gate electrode 16 which is also formed upon the active region 11 of the semiconductor substrate.

Corresponding with FIG. 1A, there is shown in FIG. 1B a schematic cross-sectional diagram of the integrated circuit after forming upon its surface a patterned first conductor layer. Shown in FIG. 1B is a semiconductor substrate 10 having formed therein an active region (corresponding with the active region 11 within FIG. 1A) defined by isolation regions 12a and 12b. Within and upon the active region of the semiconductor substrate 10 is formed a Metal Oxide Semiconductor Field Effect Transistor (MOSFET). The Metal Oxide Semiconductor Field Effect Transistor (MOSFET) comprises a gate oxide layer 14 upon which is formed and aligned a gate electrode 16, as well as a pair of insulator spacers 18a and 18b and a pair of source/drain electrodes 20a and 20b adjoining a pair of opposite edges of the gate oxide layer 14 and the gate electrode 16. Each source/drain electrode within the pair of source/drain electrodes 20a and 20b incorporates a Lightly Doped Drain (LDD) low dose ion implant structure formed within the semiconductor substrate 10 beneath the corresponding insulator spacer 18a or 18b. Upon the surfaces of the source/drain electrode 20a, the gate electrode 16 and the source/drain electrode 20b are formed, respectively, patterned metal silicide layers 22a, 22b and 22c. The patterned metal silicide layers 22a, 22b and 22c are typically, although not exclusively, formed through a self-aligned method whereby portions of a blanket metal silicide forming metal layer in contact with the exposed surfaces of the source/drain electrodes 20a and 20b, and the gate electrode 16, are annealed to form the patterned metal silicide layers 22a, 22c and 22b, respectively. Excess unreacted portions of the blanket metal silicide forming metal layer are typically removed through selective etching methods as are common in the art. Formed then upon the semiconductor substrate 10 is a series of patterned Pre-Metal Dielectric (PMD) layers 24a, 24b and 24c which form a pair of contact vias (corresponding with the pair of contact vias 25a and 25b illustrated within FIG. 1A) which access the surfaces of the metal silicide layers 22a and 22c. Finally, there is formed into the contact vias the patterned barrier layers 26a and 26b upon which are formed and aligned the corresponding patterned first conductor layers 28a and 28b. The patterned first conductor layers 28a and 28b, and the patterned barrier layers 26a and 26b are typically formed through sequential patterning of a blanket first conductor layer which is formed upon a blanket barrier layer.

Although integrated circuits similar to the integrated circuit whose schematic plan-view diagram is illustrated in FIG. 1A and whose schematic cross-sectional diagram is illustrated in FIG. 1B have become common in the art of integrated circuit design and fabrication, integrated circuits similar to the integrated circuit whose schematic plan-view diagram is illustrated in FIG. 1A and whose schematic cross-sectional diagram is illustrated in FIG. 1B are not entirely without problems in forming low contact leakage and low contact resistance connections between the source/drain electrodes 20a and 20b, and the corresponding patterned first conductor layer 28a or 28b. Contact leakage between the patterned first conductor layers 28a and 28b and the corresponding source/drain electrode 20a or 20b is typically enhanced as the as the aspect ratio of the contact vias 25a and 25b between the patterned Pre-Metal Dielectric (PMD) layers 24a, 24b and 24c increases since it becomes increasingly difficult to form uniform barrier layers, such as patterned barrier layers 26a and 26b, of adequate thickness at the bottoms of higher aspect ratio contact vias. In addition, in spite of the low contact resistance provided by the patterned metal silicide layers 22a and 22c, the contact resistance between the source/drain electrodes 20a and 20b, and the corresponding patterned first conductor layer 28a or 28b, is also increased when the width, W1, of the contact vias 25a and 25b between patterned Pre-Metal Dielectric (PMD) layers 24a, 24b and 24c plus two times the registration tolerance of the fabrication tool employed in forming the contact vias 25a and 25b between the patterned Pre-Metal Dielectric (PMD) layers 24a, 24b and 24c is greater than the width, W2, of the patterned metal silicide layer 22a or 22c. Under such conditions, a mis-registration may occur between the patterned first conductor layer 28a and the source/drain electrode 20a and/or the patterned first conductor layer 28b and the source/drain electrode 20b. The increased contact resistance caused by such mis-registration may lead to immediate functionality problems or longer term reliability problems within an integrated circuit analogous to the integrated circuit whose schematic plan-view diagram is illustrated in FIG. 1A and whose schematic cross-sectional diagram is illustrated in FIG. 1B.

Finally, although somewhat indirectly related to contact resistance and contact leakage, the integrated circuit whose schematic plan-view diagram is illustrated in FIG. 1A and whose schematic cross-sectional diagram is illustrated in FIG. 1B also typically requires for its formation two separate blanket metal layers which are employed in providing low contact leakage and low contact resistance connections to the source/drain electrodes 20a and 20b within the integrated circuit. The two separate blanket metal layers are: (1) the blanket metal silicide forming metal layer which is employed in forming the patterned metal silicide layers 22a, 22b and 22c, and (2) a second blanket metal layer which is typically employed in forming, at least in part, the patterned barrier layers 26a and 26b. Since the patterned metal silicide layers 22a, 22b and 22c, and the patterned barrier layers 26a and 26b may often be formed from metal layers which are formed from the same metal, such as but not limited to titanium metal and tungsten metal, there exists the possibility of increased manufacturing efficiency under circumstances where the functions of blanket metal silicide forming metal layer and the second blanket metal layer from which is formed the patterned barrier layers 26a and 26b may be provided with one, rather than two, blanket metal layers.

As is understood by a person skilled in the art, analogous contact leakage increases and contact resistance increases may occur within integrated circuits having formed therein integrated circuit devices other than Metal Oxide Semiconductor Field Effect Transistors (MOSFETs) (ie: integrated circuits other than the integrated circuit whose schematic plan-view diagram is shown in FIG. 1A and whose schematic cross-sectional diagram is shown in FIG. 1B), under circumstances where: (1) the width of the integrated circuit device electrode within the integrated circuit device is less than the width of a conductor element desired to be formed upon the integrated circuit device electrode plus two times the registration tolerance of a fabrication tool employed in defining the location of the conductor element, and (2) the width of the integrated circuit device electrode within the integrated circuit device cannot readily be increased.

It is thus towards the goal of forming within integrated circuits analogous to the integrated circuit whose schematic plan-view diagram is illustrated in FIG. 1A and whose schematic cross-sectional diagram is illustrated in FIG. 1B integrated circuit device electrodes which provide the desirable low contact resistance of conductor element connections formed upon metal suicide layered integrated circuit device electrodes, while simultaneously minimizing: (1) increases in contact leakage due to barrier layer thinning upon those integrated circuit device electrodes, and (2) increases in contact resistance due to mis-registration of conductor elements formed upon those integrated circuit device electrodes, that the present invention is generally directed.

The general and conventional self-aligned method for forming metal suicide layered integrated circuit device electrodes is disclosed by S. Wolf et al. in Silicon Processing for the VLSI Era, Vol. 1—Process Technology, Lattice Press (Sunset Beach, Calif., 1986) pp. 397–99.

In addition, several other methods through which conductor elements and electrodes having novel and desirable properties may be formed within integrated circuits have also been disclosed in the art. For example, Moritz, in U.S. Pat. No. 4,378,383 discloses a lift-off method employing an undercut photoresist layer for forming conductive interconnection studs within an insulator layer within an integrated circuit. In addition, Ehara et al., in U.S. Pat. No. 4,448,800 disclose a lift-off method which employs a patterned refractory metal layer as a mask layer in order to limit particulate contamination within a lift-off process employed in forming integrated circuits. Further, Ayoama et al., in U.S. Pat. No. 4,520,041 disclose a method for forming a substantially flat metallization structure on the surface of a semiconductor substrate. Yet further, Gigante et al., in U.S. Pat. No. 4,532,702 disclose a method for selectively forming tungsten interconnection studs within insulator layers within integrated circuits. Still further, Deleonibus et al., in U.S. Pat. No. 4,592,802 disclose yet another method and associated materials for fabricating interconnection studs within insulator layers within integrated circuits.

Most pertinent to the goals towards which the present invention is directed, however, is the disclosure of Jeuch et al., in U.S. Pat. No. 4,544,445. Jeuch et al. disclose a method for positioning an interconnection line on a contact hole accessing an integrated circuit device electrode within an integrated circuit. The disclosed method employs forming at least one conductor layer upon the contact hole which is defined through an insulator layer, and subsequently patterning the conductor layer(s) to form an interconnection line in contact with the integrated circuit device electrode at the bottom of the contact hole.

Desirable in the art are additional methods for forming integrated circuit device electrodes upon which may subsequently be formed conductor elements within integrated circuits. Particularly desirable are methods which provide an integrated circuit device electrode to which may be formed a low contact leakage and a low contact resistance connection with a conductor element within the integrated circuit. Most particularly desirable are methods which provide an integrated circuit device electrode to which may be formed a low contact leakage and a low contact resistance connection with a conductor element within the integrated circuit while employing a minimal number of blanket metal layers in providing the integrated circuit layers which provide the low contact leakage and low contact resistance connection.

SUMMARY OF THE INVENTION

A first object of the present invention is to provide a method for forming an integrated circuit device electrode for an integrated circuit device formed within an integrated circuit, upon which integrated circuit device electrode may be formed a conductor element within the integrated circuit.

A second object of the present invention is to provide a method for forming an integrated circuit device electrode in accord with the first object of the present invention, upon which integrated circuit device electrode may be formed a low contact leakage connection with the conductor element within the integrated circuit.

A third object of the present invention is to provide a method for forming an integrated circuit device electrode in accord with the first object of the present invention and the second object of the present invention, upon which integrated circuit device electrode may also be simultaneously formed a low contact resistance connection with the conductor element within the integrated circuit.

A fourth object of the present invention is to provide a method in accord with the first object of the present invention, the second object of the present invention and the third object of the present invention, where there is employed a minimal number of metal layers in forming the integrated circuit layers which assist in forming the low contact leakage and low contact resistance connection between the integrated circuit device electrode and the conductor element within the integrated circuit.

In accord with the objects of the present invention, there is provided by the present invention a method for forming for use within an integrated circuit device within an integrated circuit a low contact leakage and low contact resistance integrated circuit device electrode. To form the low contact leakage and low contact resistance integrated circuit device electrode of the present invention, there is first formed within a semiconductor substrate an integrated circuit device electrode. The integrated circuit device electrode has a width upon the semiconductor substrate of less than the width of a conductor element desired to be formed upon the integrated circuit device electrode plus two times the registration tolerance of a fabrication tool employed in defining the location of the conductor element desired to be formed upon the integrated circuit device electrode. Formed then upon the semiconductor substrate including the integrated circuit device electrode is a blanket metal silicide forming metal layer. The semiconductor substrate is then annealed to partially consume the blanket metal silicide forming metal layer at the location of the integrated circuit device electrode and partially consume the semiconductor substrate at the location of the integrated circuit device electrode while forming a patterned metal silicide layer aligned upon a partially consumed integrated circuit device electrode beneath a blanket partially consumed metal silicide forming metal layer at the location of the integrated circuit device electrode. Finally, the blanket partially consumed metal silicide forming metal layer is patterned to form a patterned partially consumed metal silicide forming metal layer. The patterned partially consumed metal silicide forming metal layer is aligned at least partially over the partially consumed integrated circuit device electrode and the patterned metal silicide layer. The patterned partially consumed metal silicide forming metal layer has a width greater than the width of the conductor element desired to be formed upon the integrated circuit device electrode plus two times the registration tolerance of the fabrication tool employed in defining the location of the conductor element desired to be formed upon the integrated circuit device electrode. There may also be formed and aligned upon the patterned partially consumed metal silicide forming metal layer a patterned barrier layer of width equivalent to the patterned partially consumed metal silicide forming metal layer.

The present invention provides a method for forming an integrated circuit device electrode upon which may be formed a conductor element, where there may be formed a low contact leakage connection between the integrated circuit device electrode and the conductor element. By annealing the semiconductor substrate to only partially consume the blanket metal silicide forming metal layer in forming the patterned metal silicide layer, the patterned partially consumed metal silicide forming metal layer subsequently formed from the blanket partially consumed metal silicide forming metal layer provides at least in part a patterned barrier layer to which there may be formed a low contact leakage connection between the integrated circuit device electrode and the conductor element desired to be formed upon the integrated circuit device electrode. In addition, there may be formed an additional patterned barrier layer upon the patterned partially consumed metal silicide forming metal layer to provide an enhanced contact leakage barrier. In comparison with barrier layers which are formed through a method conventional in the art by which a barrier layer is formed into a high aspect ratio contact via between adjoining patterned Pre-Metal Dielectric (PMD) layers at the bottom of which high aspect ratio contact via is formed a metal silicide layer, the thickness and uniformity of the patterned partially consumed metal silicide forming metal layer and patterned barrier layer of the present invention are more readily controlled. Thus, a conductor element formed upon the patterned partially consumed metal silicide forming metal layer or patterned barrier layer formed through the method of the present invention exhibits a lower contact leakage in comparison with barrier layers formed in locations and with thicknesses conventional to the art.

The present invention provides a method for forming an integrated circuit device electrode upon which may be formed a conductor element, where there may be formed a low contact resistance connection between the integrated circuit device electrode and the conductor element. Through annealing the semiconductor substrate and forming a patterned metal silicide layer aligned upon the partially consumed integrated circuit device electrode, there is formed a low contact resistance layer between the integrated circuit device electrode and the conductor element desired to be formed upon the integrated circuit device electrode. In addition, through forming from the blanket partially consumed metal silicide forming metal layer a patterned partially consumed metal silicide forming metal layer of width greater than the width of the conductor element desired to be formed upon the integrated circuit device electrode plus two times the registration tolerance of the fabrication tooling employed in defining the location of the conductor element, there may be avoided contact resistance increases due to mis-registration of the conductor element and the integrated circuit device electrode.

The present invention provides a method for forming within an integrated circuit an integrated circuit device electrode to which a low contact leakage and low contact resistance connection with a conductor element may be formed, where there is employed a minimal number of metal layers in forming the integrated circuit layers which assist in forming the low contact leakage and low contact resistance connection between the integrated circuit device electrode and the conductor element within the integrated circuit. By only partially consuming the blanket metal silicide forming metal layer in forming the patterned metal silicide layer aligned upon the partially consumed integrated circuit device electrode formed through the method of the present invention, a single blanket metal silicide forming metal layer may be employed in forming: (1) the patterned metal silicide layer which provides at least in part the low contact resistance layer between the integrated circuit device electrode and the conductor element; and (2) a patterned partially consumed metal silicide forming metal layer which provides at least in part the barrier layer between the integrated circuit device electrode and the conductor element. Thus, there may be employed a minimal number of metal layers in forming the integrated circuit layers which assist in providing the low contact leakage and low contact resistance connection between the integrated circuit device electrode and the conductor element desired to be formed upon the integrated circuit device electrode.

BRIEF DESCRIPTION OF THE DRAWINGS

The objects, features and advantages of the method of the present invention are understood within the context of the Description of the Preferred Embodiment, as set forth below. The Description of the Preferred Embodiment is understood within the context of the accompanying drawings, which form a material part of this disclosure, wherein:

FIG. 1A and FIG. 1B show a schematic plan-view diagram and a schematic cross-sectional diagram illustrating an integrated circuit, the integrated circuit having formed therein a Metal Oxide Semiconductor Field Effect Transistor (MOSFET) with source/drain electrodes formed through a method conventional to the art.

DESCRIPTION OF THE PREFERRED EMBODIMENT

Figure 2:
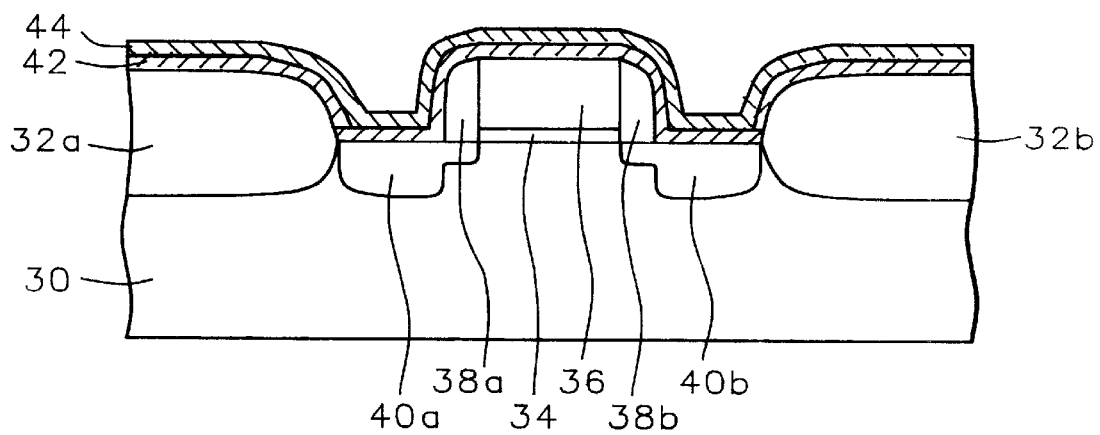
FIG. 2 to FIG. 4 and FIG. 5B show a series of schematic cross-sectional diagrams illustrating the results of progressive process stages in forming a Metal Oxide Semiconductor Field Effect Transistor (MOSFET) within an integrated circuit, the Metal Oxide Semiconductor Field Effect Transistor (MOSFET) having formed therein low contact leakage and low contact resistance source/drain electrodes in accord with the preferred embodiment of the method of the present invention.

The present invention provides a method for forming for use within an integrated circuit device within an integrated circuit an integrated circuit device electrode upon which may be formed conductor element connections with low contact leakage and low contact resistance. The method through which the present invention forms such a low contact leakage and low contact resistance integrated circuit device electrode is through forming a blanket metal silicide forming metal layer upon an integrated circuit device electrode formed within a semiconductor substrate, where the integrated circuit device electrode has a width smaller than the width of a conductor element desired to be formed upon the integrated circuit device electrode plus two times the registration tolerance of a fabrication tool employed in defining the position of the conductor element desired to be formed upon the integrated circuit device electrode. The semiconductor substrate is then annealed to form a patterned metal silicide layer aligned upon a partially consumed integrated circuit device electrode beneath a blanket partially consumed metal silicide forming metal layer at the location of the integrated circuit device electrode. The blanket partially consumed metal silicide forming metal layer is then patterned to form a patterned partially consumed metal silicide forming metal layer, where the width of the patterned partially consumed metal silicide forming metal layer is greater than the width of the conductor element desired to be formed upon the integrated circuit device electrode plus two times the registration tolerance of the fabrication tool employed in defining the location of the conductor element desired to be formed upon the integrated circuit device electrode. The patterned partially consumed metal silicide forming metal layer at least partially overlaps the patterned metal silicide layer and the partially consumed integrated circuit device electrode. Preferably, the patterned partially consumed metal silicide forming metal layer overlaps the patterned metal silicide layer and the partially consumed integrated circuit device electrode by at least the width of the conductor element desired to be formed upon the integrated circuit device electrode.

By annealing the semiconductor substrate to form a patterned metal silicide layer aligned with and upon the partially consumed integrated circuit device electrode, there is formed a low contact resistance layer through which may be formed a low contact resistance connection between the integrated circuit device electrode and the conductor element desired to be formed upon the integrated circuit device electrode. Through only partially consuming the blanket metal silicide forming metal layer there is formed a blanket partially consumed metal silicide forming metal layer from which is formed a patterned partially consumed metal silicide forming metal layer having a width greater than the width of the conductor element desired to be formed upon the integrated circuit device electrode plus two times the registration tolerance of a fabrication tool employed in defining the location of the conductor element desired to be formed upon the integrated circuit device electrode. The patterned partially consumed metal silicide forming metal layer so formed provides at least in part a contact leakage barrier to the conductor element desired to be formed upon the integrated circuit device electrode. The patterned partially consumed metal silicide forming metal layer so formed is also of a width sufficient to avoid contact resistance increases associated with mis-registration of the conductor element desired to be formed upon the integrated circuit device electrode.

The method of the present invention may be employed in forming low contact leakage and low contact resistance integrated circuit device electrodes for various types of integrated circuit devices formed within integrated circuits. The method of the present invention may be employed in forming low contact leakage and low contact resistance integrated circuit device electrodes within integrated circuit devices including but not limited to resistors, capacitors, diodes and transistors. In addition to forming low contact leakage and low contact resistance integrated circuit device electrodes within various types of integrated circuit devices, the method of the present invention may also be employed in forming low contact leakage and low contact resistance integrated circuit device electrodes within integrated circuit devices within various types of integrated circuits. The method of the present invention may be employed in forming low contact leakage and low contact resistance integrated circuit device electrodes within integrated circuit devices within integrated circuits including but not limited to Dynamic Random Access Memory (DRAM) integrated circuits, Static Random Access Memory (SRAM) integrated circuits and Application Specific Integrated Circuits (ASICs). The method of the present invention has broad applicability in forming within both various types of integrated circuit devices and various types of integrated circuits low contact leakage and low contact resistance integrated circuit device electrodes.

Figure 3:
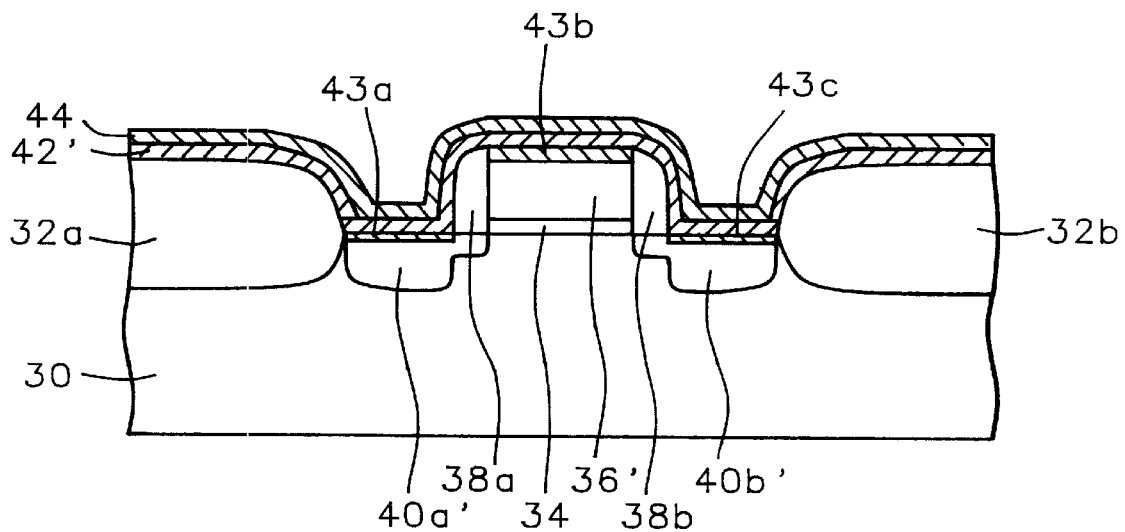
Figure 4:
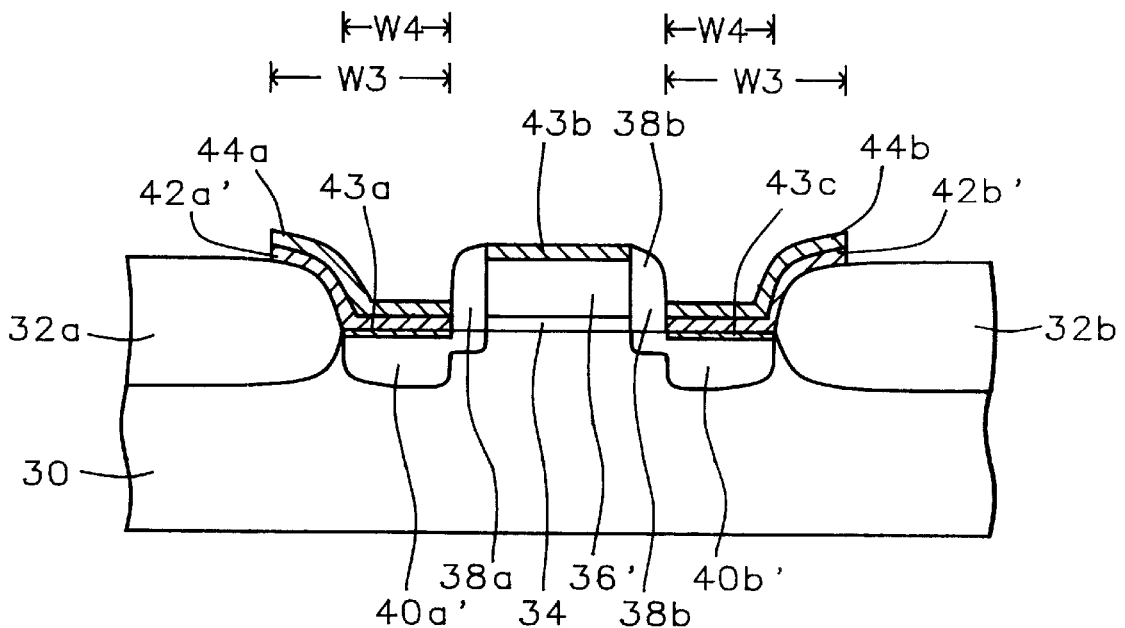
Figure 5A:
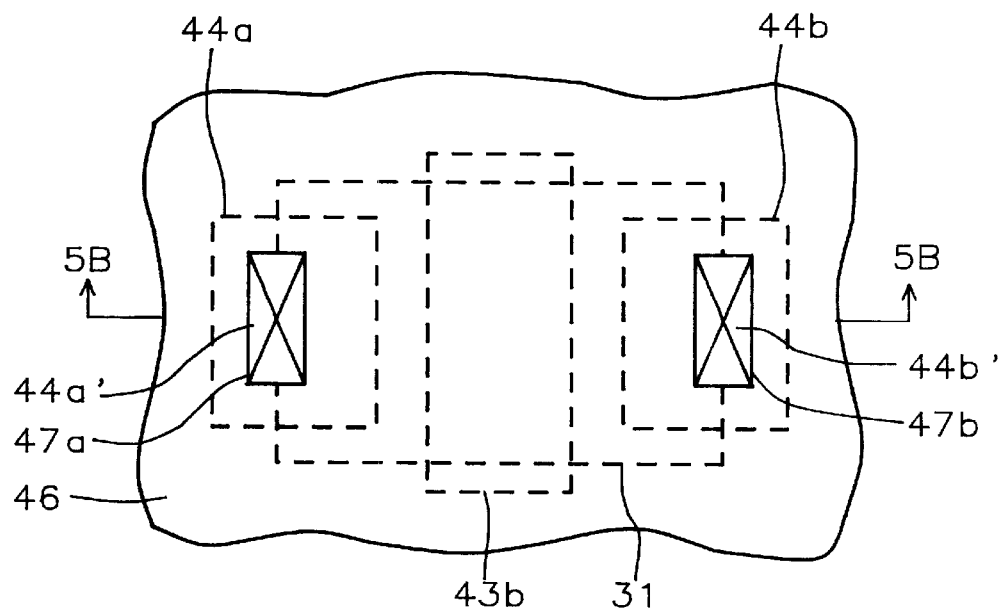
FIG. 5A shows a schematic plan-view diagram of an integrated circuit corresponding with the results of a process stage intermediate to the process stages in forming the integrated circuit whose schematic cross-sectional diagrams are illustrated in FIG. 4 and FIG. 5B.
Figure 5B:
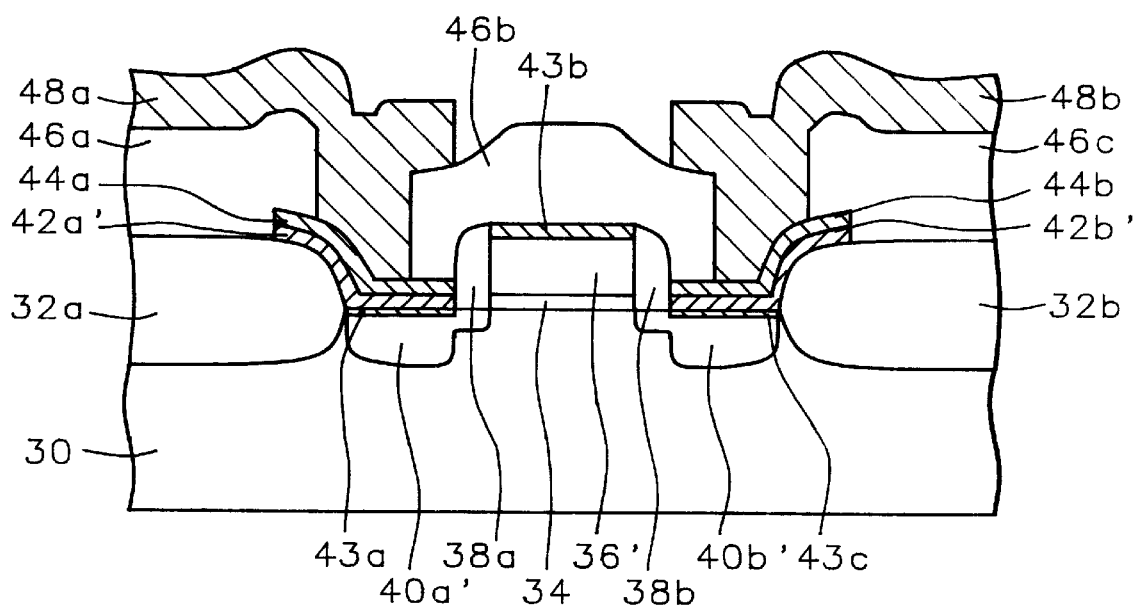

Referring now to FIG. 2 to FIG. 4 and FIG. 5B there is shown a series of schematic cross-sectional diagrams illustrating the results of progressive process stages in forming within an integrated circuit a Metal Oxide Semiconductor Field Effect Transistor (MOSFET), within which Metal Oxide Semiconductor Field Effect Transistor (MOSFET) is formed a pair of low contact leakage and low contact resistance source/drain electrodes in accord with the preferred embodiment of the method of the present invention. Shown in FIG. 5A is a schematic plan-view diagram of the integrated circuit corresponding with a process stage intermediate to the process stages whose schematic cross-sectional diagrams are illustrated in FIG. 4 and FIG. 5B. Illustrated in FIG. 2 is a schematic cross-sectional diagram of the integrated circuit at its early stages of fabrication.

Shown in FIG. 2 is semiconductor substrate 30 having formed therein and thereupon isolation regions 32a and 32b which define the active region of the semiconductor substrate 30. As is illustrated within the schematic cross-sectional diagram of FIG. 2, the isolation regions 32a and 32b define and bound the active region of the semiconductor substrate 30, but the isolation regions 32a and 32b do not overlap or cover the active region of the semiconductor substrate 30. Although the semiconductor substrate 30 upon which is practiced the preferred embodiment of the method of the present invention may be formed with either dopant polarity, any dopant concentration and any crystallographic orientation, the semiconductor substrate 30 upon which is practiced the preferred embodiment of the method of the present invention is typically and preferably a (100) silicon semiconductor substrate having an N- or P- doping. Similarly, there are several methods and materials through which isolation regions may be formed within and/or upon semiconductor substrates. Although several alternative methods may be employed in forming the isolation regions 32a and 32b within and upon the semiconductor substrate 30, the isolation regions 32a and 32b are preferably formed through a thermal oxidation method whereby portions of the silicon semiconductor substrate 30 exposed through an appropriate oxidation mask are oxidized to form isolation regions 32a and 32b of silicon oxide.

Also shown in FIG. 2 is the presence of several components of a Metal Oxide Semiconductor Field Effect Transistor (MOSFET). The components include a gate oxide layer 34 upon which is formed and aligned a gate electrode 36, a pair of insulator spacers 38a and 38b adjoining a pair of opposite edges of the gate oxide layer 34 and the gate electrode 36, and a pair of source/drain electrodes 40a and 40b formed into the surface of the semiconductor substrate 30 adjoining the pair of opposite edges of the gate oxide layer 34 and the gate electrode 36. Each source/drain electrode within the pair of source/drain electrodes 40a and 40b incorporates a Lightly Doped Drain (LDD) low dose ion implant structure formed beneath the corresponding insulator spacer 38a or 38b. Each of the preceding components of the Metal Oxide Semiconductor Field Effect Transistor (MOSFET) may be formed through methods and materials as are conventional in the art of forming Metal Oxide Semiconductor Field Effect Transistors (MOSFETs) within integrated circuits.

Typically, although not exclusively, the gate oxide layer 34 is formed through patterning through methods as are conventional in the art, of a blanket gate oxide layer formed upon the active region of the semiconductor substrate 30 through thermal oxidation of the active region of the semiconductor substrate 30 at a temperature of from about 700 to about 900 degrees centigrade. The blanket gate oxide layer so formed has a typical thickness of about 60 to about 300 angstroms. Analogously with the gate oxide layer 34, the gate electrode 36 is also typically patterned, through methods as are conventional in the art, although the patterning is undertaken upon a blanket layer of gate electrode material formed upon the blanket gate oxide layer. The blanket layer of gate electrode material may be formed of several conductive materials, including but not limited to metals, metal alloys, highly doped polysilicon and polycides (highly doped polysilicon/metal silicide stacks) formed upon the surface of the blanket gate oxide layer through a deposition method appropriate to the conductive material from which is formed the blanket layer of gate electrode material. For the preferred embodiment of the method of the present invention, the gate electrode 36 is preferably formed through patterning through methods as are conventional in the art, of a blanket layer of highly doped polysilicon formed upon the blanket gate oxide layer at a thickness of from about 1500 to about 4000 angstroms. After the gate electrode 36 has been patterned from the blanket layer of highly doped polysilicon, the gate electrode 36 may be employed as a mask in patterning the gate oxide layer 34 from the blanket gate oxide layer.

Although the insulator spacers 38a and 38b may be formed of several insulator materials, including but not limited to silicon oxide insulator materials, silicon nitride insulator materials and silicon oxynitride insulator materials, for the preferred embodiment of the method of the present invention, the insulator spacers 38a and 38b are typically and preferably formed of a silicon oxide insulator material. The insulator spacers 38a and 38b are preferably formed through an anisotropic Reactive Ion Etch (RIE) etch method whereby a blanket layer of silicon oxide insulator material is etched to form the insulator spacers 38a and 38b.

Lastly, the source/drain electrodes 40a and 40b incorporating the Lightly Doped Drain (LDD) low dose ion implant structures within the Metal Oxide Semiconductor Field Effect Transistor (MOSFET) are typically formed from a low dose ion implant prior to forming the insulator spacers 38a and 38b followed by a high dose ion implant after forming the insulator spacers 38a and 38b. The polarity desired for the Metal Oxide Semiconductor Field Effect Transistor (MOSFET) will dictate the polarity of the low dose ion implant and the high dose ion implant employed in forming the source/drain electrodes 40a and 40b incorporating the Lightly Doped Drain (LDD) low dose ion implant structures. Arsenic dopant species, boron dopant species and phosphorus dopant species are common in the art of forming source/drain electrodes. For the preferred embodiment of the method of the present invention, the source/drain electrodes 40a and 40b incorporating the Lightly Doped Drain (LDD) low dose ion implant structures are preferably formed through implanting ions of suitable polarity into the active region of the semiconductor substrate 30 through: (1) a low dose ion implant employing the gate oxide layer 34 and the gate electrode 36 as a mask at an ion implantation dose of from about 1E12 to about 1E14 ions per square centimeter and an ion implantation energy of from about 30 to about 80 keV; followed by (2) a high dose ion implant employing the gate oxide layer 34 the gate electrode 36 and the insulator spacers 38a and 38b as a mask at an ion implantation dose of from about 1E14 to about 1E16 ions per square centimeter and an ion implantation energy of from about 30 to about 80 keV.

The method of the present invention provides value in forming low contact leakage and low contact resistance integrated circuit device electrodes within integrated circuit devices when the width of the integrated circuit device electrode is less than the width of a conductor element desired to be formed upon the integrated circuit device electrode plus two times the registration tolerance of a fabrication tool employed in defining the location of the conductor element desired to be formed upon the integrated circuit device electrode. Within the context of the preferred embodiment of the method of the present invention, it is therefore desirable to establish: (1) the width of the exposed portion of the source/drain electrode 40a between the isolation region 32a and the insulator spacer 38a, or the width of the exposed portion of the source/drain electrode 40b between the isolation region 32b and the insulator spacer 38b; (2) the width of a conductor element desired to be formed upon the exposed portion of the source/drain electrode 40a or 40b, and (3) the registration tolerance of a fabrication tool employed in defining the location of the conductor element upon the source/drain electrode 40a or 40b. For the preferred embodiment of the method of the present invention: (1) the width of the exposed portions of the source/drain electrodes 40a and 40b; (2) the width of a conductor element desired to be formed upon the exposed portion of the source/drain electrode 40a or 40b; and (3) the registration tolerance of a fabrication tool employed in defining the location of the conductor element upon the source/drain electrode 40a or 40b, may be any of several values provided that the width of the exposed portion of the source/drain electrode 40a or 40b is less than the width of the conductor element desired to be formed upon the exposed portion of the source/drain electrode 40a or 40b plus two times the registration tolerance of the fabrication tool employed in defining the location of the conductor element desired to be formed upon the source/drain electrode 40a or 40b.

Finally, there is shown in FIG. 2 the presence of two blanket layers formed upon the surface of the semiconductor substrate 30, including the Metal Oxide Semiconductor Field Effect Transistor (MOSFET) and the source/drain electrodes 40a and 40b. The first blanket layer is a blanket metal silicide forming metal layer 42, and the second blanket layer is a blanket barrier layer 44. There are several metal silicide forming metals known in the art from which metal silicide layers may be formed upon annealing the metal silicide forming metals with a silicon surfaces with which the metal silicide forming metals contact. These metal silicide forming metals include but are not limited to titanium, tungsten, platinum, cobalt and tantalum. Although any of these metal silicide forming metals may be employed in forming the blanket metal silicide forming metal layer 42, the blanket metal silicide forming metal layer 42 is preferably formed of titanium. Preferably, the blanket metal silicide forming metal layer 42 formed of titanium is formed to a thickness of about 300 to about 700 angstroms upon the semiconductor substrate 30 including the source/drain electrodes 40a and 40b. The blanket metal silicide forming metal layer 42 of titanium may be formed through methods as are conventional in the art, including but not limited to thermally assisted evaporation methods, electron beam assisted evaporation methods and Physical Vapor Deposition (PVD) sputtering methods.

Analogously with the blanket metal silicide forming metal layer 42, the blanket barrier layer 44 may also be formed of several barrier materials, including but not limited to titanium nitride barrier materials and titanium-tungsten alloy barrier materials. Likewise, the blanket barrier layer 44 may also be formed through methods as are conventional in the art, including but not limited to thermally assisted evaporation methods, electron beam assisted evaporation methods and Physical Vapor Deposition (PVD) sputtering methods. For the preferred embodiment of the method of the present invention, the blanket barrier layer 44 is preferably formed from either a titanium nitride barrier material or a titanium-tungsten alloy barrier material. Preferably, the blanket barrier layer 44 is formed to a thickness of from about 800 to about 1500 angstroms. Preferably, the blanket metal silicide forming metal layer 42 and the blanket barrier layer 44 are formed sequentially within the same fabrication tool, preferably through a sputtering method.

Referring now to FIG. 3, there is shown a schematic cross-sectional diagram illustrating the results of further processing of the integrated circuit whose schematic cross-sectional diagram is illustrated in FIG. 2. Shown in FIG. 3 is the results of annealing the semiconductor substrate 30, as illustrated in FIG. 2, under conditions where the portions of the blanket metal silicide forming metal layer 42 which are in contact with exposed portions of the source/drain electrodes 40a and 40b, and the gate electrode 36, form patterned metal silicide layers 43a and 43c at the locations of the source/drain electrodes 40a and 40b, and patterned metal silicide layer 43b at the location of the gate electrode 36, while partially consuming: (1) the blanket metal silicide forming metal layer 42 to form a blanket partially consumed metal silicide forming metal layer 42'; (2) the semiconductor substrate at the locations of the source/drain electrodes 40a and 40b to form a pair of partially consumed source/drain electrodes 40a' and 40b'; and (3) the gate electrode 36 formed of polysilicon to form a partially consumed gate electrode 36' which in conjunction with the patterned metal silicide layer 43c forms a polycide gate electrode. Methods and conditions under which metal silicide forming metal layers may be annealed to form self-aligned patterned metal silicide layers through reaction with patterned silicon layers with which those metal silicide forming metal layers are in contact are known in the art. Such methods include but are not limited to conventional thermal annealing methods employing furnace heating, as well as Rapid Thermal Processing (RTP) annealing methods employing short time exposures to intense heat sources and laser annealing methods employing laser illumination at a wavelength which is absorbed by the integrated circuit layer desired to be annealed and dissipated as heat. For the preferred embodiment of the method of the present invention, the blanket metal silicide forming metal layer 42 is preferably annealed to form: (1) the patterned metal silicide layers 43a, 43b and 43c; (2) the partially consumed blanket metal silicide forming metal layer 42'; (3) the partially consumed source/drain electrodes 40a' and 40b'; and (4) the partially consumed gate electrode 36', through a Rapid Thermal Processing (RTP) annealing method at a temperature of from about 600 to about 750 degrees centigrade for a time period of less than about 60 seconds. Preferably, the patterned metal silicide layers 43a, 43b and 43c so formed are from about 100 to about 300 angstroms thick.

Referring now to FIG. 4, there is shown a schematic cross-sectional diagram illustrating the results of further processing of the integrated circuit whose schematic cross-sectional diagram is illustrated in FIG. 3. Shown in FIG. 4 is the results of successive patterning of: (1) the blanket barrier layer 44 to form the patterned barrier layers 44a and 44b; and (2) the blanket partially consumed metal silicide forming metal layer 42' to form the patterned partially consumed metal silicide forming metal layers 42a' and 42b' aligned beneath the patterned barrier layers 44a and 44b. The preceding successive patterning may be undertaken through methods as are conventional in the art, including but not limited to wet chemical etch methods and Reactive Ion Etch (RIE) plasma etch methods. It is preferred within the preferred embodiment of the method of the present invention that the patterned barrier layers 44a and 44b, and the corresponding patterned partially consumed metal silicide forming metal layers 42a' and 42b', at least partially overlap the partially consumed integrated circuit device electrode 40a' or 40b' and have a width W3 upon the semiconductor substrate greater than the width of the conductor element desired to be formed upon the source/drain electrode 40a or 40b plus two times the registration tolerance of the fabrication tool employed in defining the location of the conductor element desired to be formed upon the integrated circuit device electrode 40a or 40b. Most preferably, the patterned barrier layers 44a and 44b and the corresponding patterned partially consumed metal silicide forming metal layers 42a' and 42b' overlap the corresponding partially consumed source/drain electrode 40a' or 40b' by a width W4 greater than the width of the conductor element desired to be formed upon the source/drain electrode 40a or 40b. As is seen within the schematic cross-sectional diagram of FIG. 4, the patterned barrier layers 44a and 44b, and the co-extensive corresponding patterned partially consumed metal silicide forming metal layers 42a' and 42b', are formed at least partially overlapping the corresponding patterned metal silicide layers 43a and 43c which are formed and aligned upon the partially consumed integrated circuit device electrodes 40a' and 40b', while simultaneously contiguously extending upon or over the corresponding isolation regions 32a and 32b.

Referring now to FIG. 5A, there is shown a schematic plan-view diagram illustrating the results of further processing of the integrated circuit whose schematic cross-sectional diagram is illustrated in FIG. 4. Shown in FIG. 5A is a patterned Pre-Metal Dielectric (PMD) layer 46 having formed therethrough a pair of contact vias 47a and 47b which access a pair of exposed patterned barrier layers 44a' and 44b. Also shown in FIG. 5A are: (1) the outlines of the patterned barrier layers 44a and 44b; (2) the outline of the patterned metal silicide layer 43b; and (3) the outline of the active region of the semiconductor substrate 31 which is defined by an isolation region from which is formed the isolation regions 32a and 32b as illustrated in FIG. 2 to FIG. 4. Methods and materials through which patterned Pre-Metal Dielectric (PMD) layers may be formed within integrated circuits are known within the art of integrated circuit fabrication. Patterned Pre-Metal Dielectric (PMD) layers are typically, although not exclusively, formed within integrated circuits through patterning, through methods as are conventional in the art, of blanket Pre-Metal Dielectric (PMD) layers formed within integrated circuits. Blanket Pre-Metal Dielectric (PMD) layers may be formed through methods including but not limited to Chemical Vapor Deposition (CVD) methods, Plasma Enhanced Chemical Vapor Deposition (PECVD) methods and Physical Vapor Deposition (PVD) sputtering methods through which may be formed blanket Pre-Metal Dielectric (PMD) layers of dielectric materials including but not limited to silicon oxide dielectric materials, silicon nitride dielectric materials and silicon oxynitride materials. For the preferred embodiment of the method of the present invention, the patterned Pre-Metal Dielectric (PMD) layer 46 is preferably formed through patterning through methods as are conventional in the art, of a blanket Pre-Metal Dielectric (PMD) layer formed of a silicon oxide deposited through a Plasma Enhanced Chemical Vapor Deposition (PECVD) method, as is common in the art. Preferably, the thickness of the blanket Pre-Metal Dielectric (PMD) layer from which is formed the patterned Pre-Metal Dielectric (PMD) layer 46 is from about 6000 to about 10000 angstroms.

Referring now to FIG. 5B, there is shown a schematic cross-sectional diagram illustrating the results of further processing of the integrated circuit whose schematic plan-view diagram is illustrated in FIG. 5A. Shown in FIG. 5B is the presence of a pair of patterned first conductor layers 48a and 48b formed into the contact vias 47a and 47b (shown in FIG. 5A) between the patterned Pre-Metal Dielectric (PMD) layers 46a, 46b and 46c. The patterned first conductor layers 48a and 48b comprise the conductor elements which are desired to be formed upon the source/drain electrodes 40a and 40b. Methods and materials through which patterned conductor layers may be formed within integrated circuits are known in the art of integrated circuit manufacture. Patterned conductor layers are typically, although not exclusively, formed within integrated circuits through patterning through methods as are conventional in the art, of blanket conductor layers formed within integrated circuits. Blanket conductor layers may be formed within integrated circuits through methods including but not limited to thermally assisted evaporation methods, electron beam assisted evaporation methods, Chemical Vapor Deposition (CVD) methods and Physical Vapor Deposition (PVD) sputtering methods through which may be formed blanket conductor layers of conductor materials including but not limited to aluminum, aluminum alloy, copper and copper alloy conductor materials. For the preferred embodiment of the method of the present invention, the patterned first conductor layers 48a and 48b are preferably formed through patterning, through methods as are conventional in the art, of a corresponding blanket first conductor layer formed of an aluminum, aluminum alloy, copper or copper alloy conductor material. Most preferably, the patterned first conductor layers 48a and 48b are formed through patterning, through methods as are conventional in the art, of a blanket first conductor layer formed of an aluminum alloy conductor material, as is most common in the art.

Upon forming the patterned first conductor layers 48a and 48b, there is formed an integrated circuit having formed therein an integrated circuit device having integrated circuit device electrodes to which there may be formed low contact leakage and low contact resistance connections to conductor elements formed upon the integrated circuit device electrodes. The low contact leakage and low contact resistance connections are formed while employing a minimal number of blanket metal layers in providing the integrated circuit layers which assist in providing the low contact leakage and low contact resistance connections.

As is understood by a person skilled in the art, the low contact leakage and low contact resistance source/drain electrodes formed within a Metal Oxide Semiconductor Field Effect Transistor (MOSFET) within an integrated circuit through the preferred embodiment of the method of the present invention are illustrative of the method of the present invention rather than limiting of the method of the present invention. Revisions and modifications may be made to the methods, materials, structures and dimensions through which are formed the low contact leakage and low contact resistance source/drain electrodes within the Metal Oxide Semiconductor Field Effect Transistor (MOSFET) formed through the preferred embodiment of the method of the present invention while still forming low contact leakage and low contact resistance integrated circuit device electrodes within integrated circuit devices in accord with the spirit and scope of the present invention, as defined by the accompanying claims.

What is claimed is:
1. An integrated circuit comprising:
a semiconductor substrate;
a single layer isolation region formed upon the semiconductor substrate, the single layer isolation region lat- erally bounding an active region of the semiconductor substrate laterally adjoining the single layer isolation region, but the single layer isolation layer not overlapping the active region of the semiconductor substrate laterally adjoining the single layer isolation region;

an integrated circuit device formed at least in part within the active region of the semiconductor substrate, the integrated circuit device having an integrated circuit device electrode formed within a portion of the active region of the semiconductor substrate laterally bounded by the single layer isolation region;

a patterned metal silicide layer aligned upon the integrated circuit device electrode;

a patterned metal silicide forming metal layer formed at least partially overlapping the patterned metal silicide layer and formed contiguously extending upon the single layer isolation region, and a patterned dielectric layer formed over the semiconductor substrate and the patterned metal silicide forming metal layer, where the patterned dielectric layer has an aperture defined therein, the aperture being formed over the patterned metal silicide forming metal layer at a location at least in part over the single layer isolation region.

2. The integrated circuit of claim 1 wherein the patterned metal silicide layer is formed from a metal silicide chosen from the group of metal silicides consisting of titanium silicide, tungsten silicide, platinum silicide, cobalt silicide and tantalum silicide.

3. The integrated circuit of claim 1 wherein the patterned metal silicide layer is a patterned titanium silicide layer having a thickness of from about 100 to about 300 angstroms.

4. The integrated circuit of claim 1 further comprising a patterned barrier layer formed and aligned upon the patterned metal silicide forming metal layer.

5. The integrated circuit of claim 4 wherein the patterned barrier layer is formed from a barrier material chosen from the group of barrier materials consisting of titanium nitride and titanium tungsten alloy barrier materials.

6. The integrated circuit of claim 5 wherein the patterned barrier layer is from about 800 to about 1500 angstroms thick.

7. The integrated circuit of claim 1 further comprising a conductor element formed over the patterned metal silicide forming metal layer and into the aperture, the conductor element being formed at least in part from a conductor material chosen from the group of conductor materials consisting of aluminum, aluminum alloy, copper and copper alloy conductor materials.

8. The integrated circuit of claim 1 wherein a first metal employed within the patterned metal silicide layer is the same as a second metal employed within the patterned metal silicide forming metal layer.

* * * * *